United States Patent
Liu et al.

(10) Patent No.: US 8,025,813 B2
(45) Date of Patent: Sep. 27, 2011

(54) CHEMICAL MECHANICAL POLISHING COMPOSITION AND METHODS RELATING THERETO

(75) Inventors: Zhendong Liu, King of Prussia, PA (US); Yi Guo, Newark, DE (US); Kancharla-Arun Kumar Reddy, Bear, DE (US); Guangyun Zhang, Furlong, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 43 days.

(21) Appl. No.: 12/617,140

(22) Filed: Nov. 12, 2009

(65) Prior Publication Data

US 2011/0111595 A1    May 12, 2011

(51) Int. Cl.
*C09K 13/00*        (2006.01)
(52) U.S. Cl. .................. 252/79.1; 252/79.2; 438/692
(58) Field of Classification Search ............... 252/79.1, 252/79.2; 438/692, 693; 216/88, 89
See application file for complete search history.

(56) References Cited

U.S. PATENT DOCUMENTS

| | | | |
|---|---|---|---|
| 7,063,597 B2 | 6/2006 | Prabhu et al. | |
| 7,253,111 B2 | 8/2007 | Liu et al. | |
| 7,767,581 B2 * | 8/2010 | Bian ........................... | 438/692 |
| 2004/0040217 A1 | 3/2004 | Takashina et al. | |
| 2009/0291559 A1 * | 11/2009 | White et al. .................. | 438/693 |

OTHER PUBLICATIONS

Nickles et al., "Slurrless fixed-abrasive web for direct polish STI CMP", Semicon Korea STS (2003).
Jin et al., "Advanced front end CMP and integration solutions", CMP-MIC, pp. 119-128 (2000).
"Diverse CMP needs require a dielectric selectivity platform", Solid State Technology, vol. 48, Iss. 3 (2005).

* cited by examiner

*Primary Examiner* — Lan Vinh
(74) *Attorney, Agent, or Firm* — Thomas S. Deibert

(57) ABSTRACT

A chemical mechanical polishing composition useful for chemical mechanical polishing of a substrate, wherein the substrate comprises a silicon oxide material and a silicon nitride material; and methods of making and using the chemical mechanical polishing composition. The chemical mechanical polishing composition comprises, as initial components: at least one of a first substance and a second substance; wherein the first substance is according to formula I

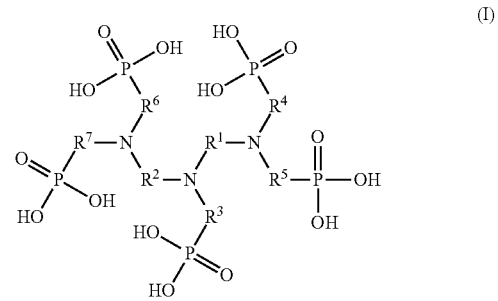

(I)

wherein the second substance is according to formula II

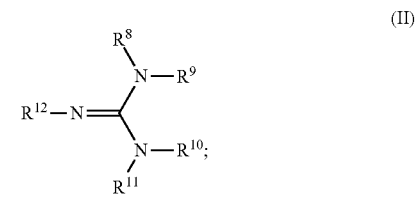

(II)

an abrasive; and water.

10 Claims, No Drawings

CHEMICAL MECHANICAL POLISHING COMPOSITION AND METHODS RELATING THERETO

The present invention relates to a chemical mechanical polishing composition and methods of making and using the same. More particularly, the present invention relates to a chemical mechanical polishing composition for polishing a substrate comprising a silicon oxide material and a silicon nitride material.

Shallow trench isolation (STI) structures are used to separate transistors and transistor components, such as source/drain junctions or channel stops. STI structures are typically formed by depositing a series of dielectric materials on a substrate and then polishing the substrate to remove the excess dielectric materials. An example of a conventional STI structure includes depositing a silicon nitride layer on an oxide layer formed on a silicon substrate, patterning and etching the substrate to form a feature definition, depositing a silicon oxide fill of the feature definitions, and polishing the substrate surface to remove excess silicon oxide to form a feature. The silicon nitride layer acts as a barrier layer, a hard mask during etching of the features in the substrate and as a polishing stop during subsequent polishing processes. Such STI fabrication processes require polishing the silicon oxide layer to the silicon nitride layer with a minimal amount of silicon nitride removal in order to prevent damaging of the underlying materials.

The most widely used approach for polishing STI substrates is a chemical mechanical polishing shallow trench isolation (CMP-STI) process using three separate polishing steps with three different polishing slurries. The first polishing step typically uses a silica based slurry with a high abrasive level for bulk oxide removal. The second polishing step typically used a ceria based slurry with a high selectivity (e.g., >15) for silicon oxide versus silicon nitride. Followed by a third polishing step, a buff step to help clean particles from the wafer surface. The third polishing step may remove some silicon oxide and silicon nitride to correct the topography. The third polishing step is the final step, accordingly planarity and defectivity of the substrate surface following this step are critical.

As device geometries shrink, planarity requirements for STI processes become more stringent. Coupled with the ever present cost pressures, more and more chip manufacturers are turning to direct polish CMP-STI, in place of much more expensive and time-consuming reverse masking STI preparation approaches. Key process performance metrics for CMP-STI are the post-polish trench oxide thickness, the active area nitride thicknesses, and the within-die (WID) and within-wafer (WIW) thickness ranges for both.

One approach to satisfying the needs presented by direct polish CMP-STI process, is disclosed by Prabhu et al. in U.S. Pat. No. 7,063,597. Prabhu et al. teach a method for processing a substrate, comprising: providing a substrate comprising a bulk dielectric material disposed on a patterned dielectric material in an amount sufficient to fill feature definitions of the patterned dielectric material; polishing the substrate with a first polishing composition and an abrasive-free polishing article until bulk dielectric material is substantially removed; and polishing the substrate with a second polishing composition and a fixed-abrasive polishing article to remove residual bulk dielectric material and expose the patterned dielectric material between the feature definitions.

Notwithstanding, there still exists a need for chemical mechanical polishing (CMP) compositions and methods that are tunable and facilitate the removal of both silicon oxide and silicon nitride for use in the final step of the three step CMP-STI process.

In one aspect of the present invention, there is provided a chemical mechanical polishing composition, comprising, as initial components: a first substance according to formula I

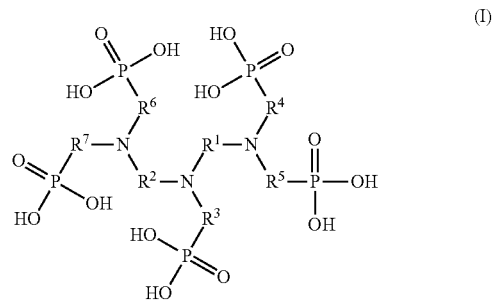

wherein each of $R^1$, $R^2$, $R^3$, $R^4$, $R^5$, $R^6$ and $R^7$ is a bridging group having a formula $-(CH_2)_n-$, wherein n is an integer selected from 1 to 10, and wherein, optionally, one or more of the nitrogens in the first substance can be provided in a quaternary form, where the nitrogen assumes a positive charge; a second substance according to formula II

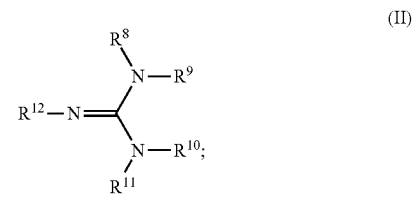

wherein each of $R^8$, $R^9$, $R^{10}$, $R^{11}$ and $R^{12}$ is selected from hydrogen and an alkyl group having 1 to 6 carbon atoms, wherein, optionally, two or more of $R^8$, $R^9$, $R^{10}$, $R^{11}$ and $R^{12}$ are combined into a ring structure, and wherein, optionally, one or more of the nitrogens in the second substance can be provided in a quaternary form, where the nitrogen assumes a positive charge; an abrasive; and water.

In another aspect of the present invention, there is provided a method of making the chemical mechanical polishing composition, comprising: providing a first substance according to formula I

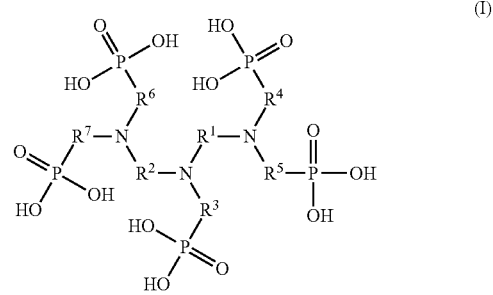

wherein each of $R^1$, $R^2$, $R^3$, $R^4$, $R^5$, $R^6$ and $R^7$ is a bridging group having a formula $-(CH_2)_n-$, wherein n is an integer selected from 1 to 10, and optionally, wherein one or more of the nitrogens in the first substance can be provided in a quaternary form, where the nitrogen assumes a positive charge; providing a second substance according to formula II

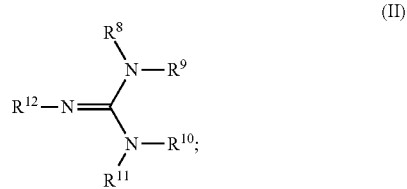

wherein each of $R^8$, $R^9$, $R^{10}$, $R^{11}$ and $R^{12}$ is an alkyl group having 1 to 6 carbon atoms, optionally, two or more of $R^8$, $R^9$, $R^{10}$, $R^{11}$ and $R^{12}$ are combined into a ring structure, and optionally, wherein one or more of the nitrogens in the second substance can be provided in a quaternary form, where the nitrogen assumes a positive charge; providing an abrasive; providing water; providing a pH adjusting agent; combining the first substance, the second substance, the abrasive and the water to form a slurry; and, adding the pH adjusting agent to the slurry to adjust the pH of the slurry to <7.

In another aspect of the present invention, there is provided a method of chemical mechanical polishing of a substrate, comprising: providing a substrate, wherein the substrate comprises a silicon oxide material and a silicon nitride material; providing at least one of a first substance and a second substance; wherein the first substance is according to formula I

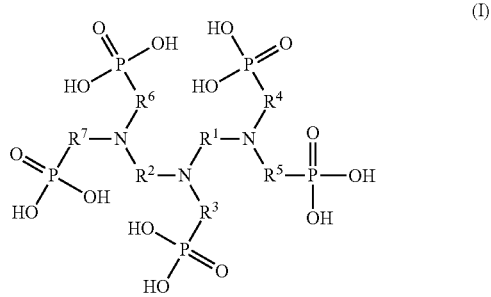

wherein each of $R^1$, $R^2$, $R^3$, $R^4$, $R^5$, $R^6$ and $R^7$ is a bridging group having a formula —$(CH_2)_n$—, wherein n is an integer selected from 1 to 10, and optionally, wherein one or more of the nitrogens in the first substance can be provided in a quaternary form, where the nitrogen assumes a positive charge; and, wherein the second substance is according to formula II

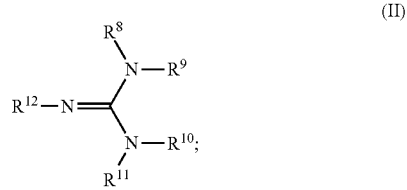

wherein each of $R^8$, $R^9$, $R^{10}$, $R^{11}$ and $R^{12}$ is selected from hydrogen and an alkyl group having 1 to 6 carbon atoms, optionally, two or more of $R^8$, $R^9$, $R^{10}$, $R^{11}$ and $R^{12}$ are combined into a ring structure, and optionally, wherein one or more of the nitrogens in the second substance can be provided in a quaternary form, where the nitrogen assumes a positive charge; providing an abrasive; providing water; providing a pH adjusting agent; combining (a) at least one of the first substance and the second substance, (b) the abrasive and (c) the water to form a chemical mechanical polishing composition; and, adding the pH adjusting agent to adjust the pH of the chemical mechanical polishing composition to <7; providing a chemical mechanical polishing pad; creating dynamic contact at an interface between the chemical mechanical polishing pad and the substrate; and, dispensing the chemical mechanical polishing composition onto the chemical mechanical polishing pad at or near the interface between the chemical mechanical polishing pad and the substrate; wherein at least some of the silicon oxide material and the silicon nitride material are removed from the substrate.

DETAILED DESCRIPTION

The chemical mechanical polishing composition of the present invention is useful for polishing a substrate comprising a silicon oxide material (e.g., TEOS) and a silicon nitride material (e.g., $Si_3N_4$). The chemical mechanical polishing composition of the present invention is particularly useful in the third polishing step of a three step CMP-STI process where planarization of the surface and minimization of defectivity are key.

The unique formulation of the chemical mechanical polishing composition of the present invention provides for the tailoring of the chemical mechanical polishing composition's removal rate selectivity of silicon oxide to silicon nitride by varying the concentrations of the first substance and of the second substance added to the composition as initial components. The chemical mechanical polishing composition of the present invention exhibits a tailorable removal rate selectivity of silicon oxide to silicon nitride of 0.2 to 5.0. Preferably, the chemical mechanical polishing composition of the present invention is formulated to exhibit a silicon oxide to silicon nitride removal rate selectivity of 0.5 to 2.0; more preferably of 0.75 to 1.5; still more preferably 0.8 to 1.2; most preferably 0.9 to 1.2.

The chemical mechanical polishing composition of the present invention contains, as an initial component, a first substance according to formula I

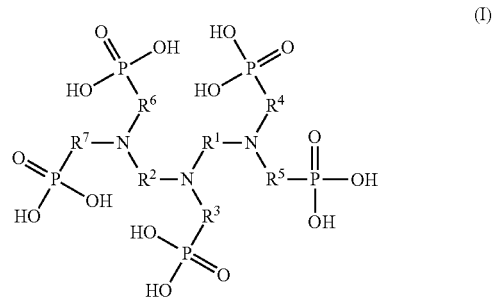

wherein each of $R^1$, $R^2$, $R^3$, $R^4$, $R^5$, $R^6$ and $R^7$ is a bridging group having a formula —$(CH_2)_n$—, wherein n is an integer selected from 1 to 10. Preferably, n is an integer independently selected from 1 to 4 for each of $R^1$, $R^2$, $R^3$, $R^4$, $R^5$, $R^6$ and $R^7$. More preferably, n is an integer independently selected from 2 to 4 for each of $R^1$, $R^2$, $R^3$, $R^4$, $R^5$, $R^6$ and $R^7$. Most preferably the first substance is diethylenetriaminepentakis(methylphosphonic acid), which has the following formula

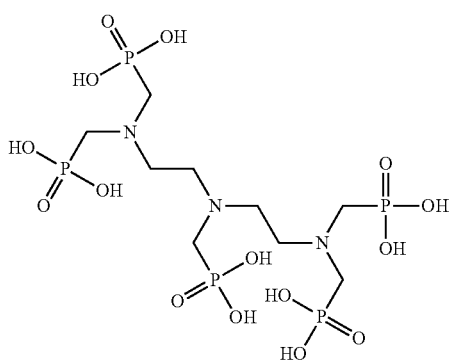

Optionally, one or more of the nitrogens in the first substance can be provided in a quaternary form, wherein the nitrogen assumes a positive charge.

It has been determined that the addition of the first substance, as an initial component, of the chemical mechanical polishing composition of the present invention operates to increase the silicon nitride removal rate, while having a minimal affect on the silicon oxide removal rate of the chemical mechanical polishing composition at acidic pH levels. By selective addition of the first substance as an initial component of the chemical mechanical polishing composition of the present invention, the silicon nitride removal rate exhibited by the chemical mechanical polishing composition can be tailored to suit specific polishing applications.

The chemical mechanical polishing composition of the present invention comprises, as an initial component, 0.001 to 1 wt % of the first substance. The amount of the first substance used in the chemical mechanical polishing composition is selected to tailor the silicon nitride removal rate relative to the silicon oxide removal rate. In some preferred applications, the chemical mechanical polishing composition comprises, as an initial component, 0.001 to 0.2 wt %, more preferably 0.008 to 0.03 wt %, most preferably 0.009 to 0.015 wt % of the first substance.

The chemical mechanical polishing composition of the present invention also contains, as an initial component, a second substance according to formula II

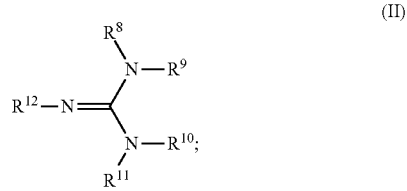

(II)

wherein each of $R^8$, $R^9$, $R^{10}$, $R^{11}$ and $R^{12}$ is selected from hydrogen and an alkyl group having 1 to 6 carbon atoms (e.g., N,N,N',N'-tetramethyl-N'',N''-dimethylguanidinium). Preferably, each of $R^8$, $R^9$, $R^{10}$, $R^{11}$ and $R^{12}$ are independently selected from a methyl group, an ethyl group, a propyl group, and a butyl group. More preferably, each of $R^8$, $R^9$, $R^{10}$, $R^{11}$ and $R^{12}$ is independently selected from a methyl group and an ethyl group. Most preferably, each of $R^8$, $R^9$, $R^{10}$, $R^{11}$ and $R^{12}$ is a methyl group and the second substance is tetramethylguanidine. Optionally, one or more of $R^8$, $R^9$, $R^{10}$, $R^{11}$ and $R^{12}$ is an alkyl group having 1 to 6 carbon atoms, wherein the alkyl group is a halogenated alkyl group, such as a fully or partially halogenated ethyl, propyl, isopropyl, butyl, isobutyl, sec-butyl or tert-butyl group. Optionally, two or more of $R^8$, $R^9$, $R^{10}$, $R^{11}$ and $R^{12}$ can be combined to form a saturated or unsaturated ring structure (e.g., 1-methyl-7-n-propyl-1,5,7-triazabicyclo[4.4.0]dec-5-enium). Optionally, one or more of the nitrogens in the second substance can be provided in a quaternary form, wherein the nitrogen assumes a positive charge.

It has been determined that the addition of the second substance as an initial component of the chemical mechanical polishing composition of the present invention operates to increase the silicon oxide removal rate, while decreasing the silicon nitride removal rate of the chemical mechanical polishing composition at acidic pH levels. By selective addition of the second substance in combination with the first substance, as initial components, of the chemical mechanical polishing composition of the present invention, the silicon oxide and silicon nitride removal rates exhibited by the chemical mechanical polishing composition can be tailored to suit specific polishing applications.

The amount of the second substance used in the chemical mechanical polishing composition is selected to tailor the silicon oxide and silicon nitride removal rates. The chemical mechanical polishing composition of the present invention preferably comprises, as an initial component, 0.001 to 5 wt % of the second substance. More preferably, the chemical mechanical polishing composition comprises, as an initial component, 0.01 to 1 wt %, still more preferably 0.01 to 0.5 wt %, yet still more preferably 0.01 to 0.1 wt %, most preferably 0.02 to 0.06 wt % of the second substance.

The amount of abrasive used in the chemical mechanical polishing composition of the present invention can be selected to tailor the silicon oxide and silicon nitride removal rates. An increase in the abrasive concentration in the chemical mechanical polishing composition operates to increase the silicon oxide removal rate and the silicon nitride removal rate. Preferably, the chemical mechanical polishing composition is formulated to contain a sufficient concentration of abrasive to exhibit a silicon oxide removal rate of 400 to 1100 Å/min; and a silicon nitride removal rate of 400 to 1100 Å/min.

Abrasive suitable for use in the chemical mechanical polishing composition of the present invention include, for example, inorganic oxides, inorganic hydroxides, inorganic hydroxide oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations comprising at least one of the foregoing oxides. Modified forms of these inorganic oxides, such as, organic polymer-coated inorganic oxide particles and inorganic coated particles can also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Preferably, the abrasive is a colloidal silica abrasive. Colloidal silica abrasive suitable for use in the present method for chemical mechanical polishing contain at least one of precipitated silica and agglomerated silica.

In some embodiments of the present invention, the abrasive used in the chemical mechanical polishing composition is a colloidal silica having an average particle size of ≦100 nm. In some aspects of these embodiments, the colloidal silica has an average particle size of 1 to 100 nm. In some aspects of these embodiments, the colloidal silica has an average particle size of 1 to 50 nm. In some aspects of these embodiments, the colloidal silica has an average particle size of 1 to 40 nm. In some aspects of these embodiments, the colloidal silica has an average particle size of 1 to 30 nm. In some aspects of these embodiments, the colloidal silica has an average particle size of 20 to 30 nm.

In some embodiments of the present invention, the chemical mechanical polishing composition used contains 1 to 40 wt % abrasive. In some aspects of these embodiments, the chemical mechanical polishing composition used contains 1 to 25 wt % abrasive. In some aspects of these embodiments, the chemical mechanical polishing composition used contains 1 to 10 wt % abrasive. In some aspects of these embodiments, the chemical mechanical polishing composition used contains 1 to 5 wt % abrasive.

In some embodiments of the present invention, the chemical mechanical polishing composition used contains 1 to 40 wt %, preferably 1 to 25 wt %, more preferably 1 to 10 wt %, most preferably 1 to 5 wt % colloidal silica abrasive, wherein the colloidal silica abrasive has an average particle size of $\leqq 100$, preferably 1 to 100 nm, more preferably 1 to 50 nm, still more preferably 1 to 40 nm, yet still more preferably 1 to 30 nm, most preferably 20 to 30 nm.

The water used in the chemical mechanical polishing composition of the present invention is preferably at least one of deionized and distilled to limit incidental impurities.

The chemical mechanical polishing composition of the present invention has a pH of <7, more preferably of $\leqq 5$; still more preferably of 2 to 4, most preferably of 2 to 3. The chemical mechanical polishing composition can include an inorganic pH adjusting agent. In some embodiments of the present invention, the pH adjusting agent is selected from an inorganic acid (e.g., nitric acid, sulfuric acid, hydrochloric acid and phosphoric acid) and an inorganic base (e.g., potassium hydroxide). In some aspects of these embodiments, the pH adjusting agent is at least one of nitric acid ($HNO_3$) and potassium hydroxide (KOH). In some aspects of these embodiments, the pH adjusting agent is phosphoric acid.

Optionally, the chemical mechanical polishing composition of the present invention comprises, as initial components: 0.001 to 1 wt % (preferably 0.001 to 0.2 wt %, more preferably 0.008 to 0.03 wt %, most preferably 0.009 to 0.015 wt %) of the first substance; 0.001 to 5 wt % (preferably 0.01 to 1 wt %, more preferably 0.01 to 0.5 wt %, still more preferably 0.01 to 0.1 wt %, most preferably 0.02 to 0.06 wt %) of the second substance; 1 to 40 wt % (preferably 1 to 25 wt %, more preferably 1 to 10 wt %, most preferably 1 to 5 wt %) abrasive; and water; wherein the chemical mechanical polishing composition is formulated to exhibit a silicon oxide removal rate of 400 to 1100 Å/min, a silicon nitride removal rate of 400 to 1100 Å/min, and a silicon oxide to silicon nitride selectivity of 0.2 to 4.0 (preferably 0.5 to 2.0, more preferably 0.75 to 1.5, still more preferably 0.8 to 1.2, most preferably 0.9 to 1.1) at a pH of <7 (preferably $\leqq 5$, more preferably 2 to 4, most preferably 2 to 3); preferably wherein the first substance is diethylenetriaminepentakis(methylphosphonic acid) and the second substance is tetramethylguanidine.

The chemical mechanical polishing composition used in the chemical mechanical polishing method of the present invention optionally further comprises additional additives selected from dispersants, surfactants, buffers, anti-foaming agents and biocides.

Preferably, the chemical mechanical polishing composition of the present invention, comprises, as initial components, diethylenetriaminepentakis(methylphosphonic acid) as the first substance and tetramethylguanidine as the second substance.

The method of making the chemical mechanical polishing composition of the present invention, comprises: providing a first substance according to formula I, wherein each of $R^1$, $R^2$, $R^3$, $R^4$, $R^5$, $R^6$ and $R^7$ is a bridging group having a formula —$(CH_2)_n$—, wherein n is an integer selected from 1 to 10 (preferably n is an integer independently selected from 1 to 4 for each of $R^1$, $R^2$, $R^3$, $R^4$, $R^5$, $R^6$, $R^7$; more preferably n is an integer independently selected from 2 to 4 for each of $R^1$, $R^2$, $R^3$, $R^4$, $R^5$, $R^6$, $R^7$; most preferably the first substance is diethylenetriaminepentakis(methylphosphonic acid)), (optionally, one or more of the nitrogens in the first substance can be provided in a quaternary form, wherein the nitrogen assumes a positive charge); providing a second substance according to formula II, wherein each of $R^8$, $R^9$, $R^{10}$, $R^{11}$ and $R^{12}$ is selected from hydrogen and an alkyl group having 1 to 6 carbon atoms (e.g., N,N,N',N'-tetramethyl-N'',N'''-dimethylguanidinium), (preferably, each of $R^8$, $R^9$, $R^{10}$, $R^{11}$ and $R^{12}$ are independently selected from a methyl group, an ethyl group, a propyl group, and a butyl group; more preferably, each of $R^8$, $R^9$, $R^{10}$, $R^{11}$ and $R^{12}$ is independently selected from a methyl group and an ethyl group; most preferably, each of $R^8$, $R^9$, $R^{10}$, $R^{11}$ and $R^{12}$ is a methyl group and the second substance is tetramethylguanidine), (optionally, one or more of $R^8$, $R^9$, $R^{10}$, $R^{11}$ and $R^{12}$ is an alkyl group having 1 to 6 carbon atoms, wherein the alkyl group is a halogenated alkyl group, such as a fully or partially halogenated ethyl, propyl, isopropyl, butyl, isobutyl, sec-butyl or tert-butyl group), (optionally, two or more of $R^8$, $R^9$, $R^{10}$, $R^{11}$ and $R^{12}$ can be combined to form a saturated or unsaturated ring structure (e.g., 1-methyl-7-n-propyl-1,5,7-triazabicyclo[4.4.0]dec-5-enium)), (optionally, one or more of the nitrogens in the second substance can be provided in a quaternary form, wherein the nitrogen assumes a positive charge); providing an abrasive; providing water; providing a pH adjusting agent; combining the first substance, the second substance, the abrasive and the water to form a slurry; and, adding the pH adjusting agent to the slurry to adjust the pH of the slurry to <7 (preferably of $\leqq 5$, more preferably of 2 to 4, most preferably of 2 to 3). The pH adjusting agents used preferably include inorganic pH adjusting agents. For example, the pH adjusting agent can be selected from an inorganic acid (e.g., nitric acid, sulfuric acid, hydrochloric acid and phosphoric acid) and an inorganic base (e.g., potassium hydroxide). Preferably, the pH adjusting agent is at least one of nitric acid ($HNO_3$) and potassium hydroxide (KOH).

The method of the present invention of chemical mechanical polishing of a substrate, comprises: providing a substrate, wherein the substrate comprises a silicon oxide material and a silicon nitride material; providing a chemical mechanical polishing composition according to the present invention; providing a chemical mechanical polishing pad; creating dynamic contact at an interface between the chemical mechanical polishing pad and the substrate; and, dispensing the chemical mechanical polishing composition onto the chemical mechanical polishing pad at or near the interface between the chemical mechanical polishing pad and the substrate; wherein at least some of the silicon oxide material and the silicon nitride material are removed from the substrate.

Preferably, in the method of the present invention of chemical mechanical polishing of the substrate comprising a silicon oxide material and a silicon nitride material, the chemical mechanical polishing composition of the present invention is preferably formulated to exhibit a silicon oxide to silicon nitride removal rate selectivity of 0.2 to 4.0. More preferably, the chemical mechanical polishing composition is formulated to exhibit a silicon oxide to silicon nitride removal rate selectivity of 0.5 to 2.0, still more preferably of 0.75 to 1.5, yet still more preferably of 0.8 to 1.2, most preferably of 0.9 to 1.2.

Preferably, in the method of the present invention of chemical mechanical polishing of the substrate comprising a silicon oxide material and a silicon nitride material, the chemical mechanical polishing composition of the present invention is preferably formulated to exhibit a silicon oxide removal rate of 400 to 1100 Å/min; and a silicon nitride removal rate of 400 to 1100 Å/min.

Preferably, the chemical mechanical polishing method of the present invention comprises applying a nominal force pressing the substrate and the chemical mechanical polishing pad together (i.e., a polishing pad pressure). Preferably, the polishing pad pressure is 3 to 35 kPa. More preferably, the polishing pad pressure is 10 to 30 kPa. Most preferably, the polishing pad pressure is 17 to 25 kPa.

Preferably, the method of the present invention of chemical mechanical polishing of a substrate, comprises: providing a substrate, wherein the substrate comprises a silicon oxide material and a silicon nitride material; providing at least one of a first substance and a second substance (preferably providing both a first substance and a second substance); wherein the first substance is according to formula I, wherein each of $R^1$, $R^2$, $R^3$, $R^4$, $R^5$, $R^6$ and $R^7$ is a bridging group having a formula —$(CH_2)_n$—, wherein n is an integer selected from 1 to 10, (preferably n is an integer independently selected from 1 to 4 for each of $R^1$, $R^2$, $R^3$, $R^4$, $R^5$, $R^6$, $R^7$; more preferably n is an integer independently selected from 2 to 4 for each of $R^1$, $R^2$, $R^3$, $R^4$, $R^5$, $R^6$, $R^7$; most preferably the second substance is diethylenetriaminepentakis(methylphosphonic acid)), (optionally, one or more of the nitrogens in the first substance can be provided in a quaternary form, wherein the nitrogen assumes a positive charge); and, wherein the second substance is according to formula II, providing a second substance according to formula II, wherein each of $R^8$, $R^9$, $R^{10}$, $R^{11}$ and $R^{12}$ is selected from hydrogen and an alkyl group having 1 to 6 carbon atoms (e.g., N,N,N',N'-tetramethyl-N", N"-dimethylguanidinium), (preferably, each of $R^8$, $R^9$, $R^{10}$, $R^{11}$ and $R^{12}$ are independently selected from a methyl group, an ethyl group, a propyl group, and a butyl group; more preferably, each of $R^8$, $R^9$, $R^{10}$, $R^{11}$ and $R^{12}$ is independently selected from a methyl group and an ethyl group; most preferably, each of $R^8$, $R^9$, $R^{10}$, $R^{11}$ and $R^{12}$ is a methyl group and the second substance is tetramethylguanidine), (optionally, one or more of $R^8$, $R^9$, $R^{10}$, $R^{11}$ and $R^{12}$ is an alkyl group having 1 to 6 carbon atoms, wherein the alkyl group is a halogenated alkyl group, such as a fully or partially halogenated ethyl, propyl, isopropyl, butyl, isobutyl, sec-butyl or tert-butyl group), (optionally, two or more of $R^8$, $R^9$, $R^{10}$, $R^{11}$ and $R^{12}$ can be combined to form a saturated or unsaturated ring structure (e.g., 1-methyl-7-n-propyl-1,5,7-triazabicyclo[4.4.0]dec-5-enium)), (optionally, one or more of the nitrogens in the second substance can be provided in a quaternary form, wherein the nitrogen assumes a positive charge); providing water; providing a pH adjusting agent; combining (a) at least one of the first substance and the second substance, (b) the abrasive and (c) the water to form a chemical mechanical polishing composition; and, adding the pH adjusting agent to adjust the pH of the chemical mechanical polishing composition to <7; providing a chemical mechanical polishing pad; creating dynamic contact at an interface between the chemical mechanical polishing pad and the substrate; and, dispensing the chemical mechanical polishing composition onto the chemical mechanical polishing pad at or near the interface between the chemical mechanical polishing pad and the substrate; wherein at least some of the silicon oxide material and the silicon nitride material are removed from the substrate; wherein the chemical mechanical polishing composition provided exhibits a silicon oxide to silicon nitride removal rate selectivity of 0.2 to 4.0 (more preferably 0.5 to 2.0, still more preferably 0.75 to 1.5, yet still more preferably 0.8 to 1.2, most preferably 0.9 to 1.2); exhibits a silicon oxide removal rate of 400 to 1100 Å/min; exhibits a silicon nitride removal rate of 400 to 1100 Å/min; with a platen speed of 93 revolutions per minute, a carrier speed of 87 revolutions per minute, a chemical mechanical polishing composition flow rate of 200 ml/min, and a nominal down force of 20.7 kPa on a 200 mm polishing machine; wherein the chemical mechanical polishing pad comprises a poromeric polyurethane polishing layer coated over a felt substrate (e.g., Politex™ polishing pads available from Rohm and Haas Electronic Materials CMP Inc.).

Preferably, the method of the present invention of chemical mechanical polishing of a substrate, comprises: providing a substrate, wherein the substrate comprises a silicon oxide material and a silicon nitride material; providing at least one of a first substance and a second substance (preferably providing both a first substance and a second substance); wherein the first substance is according to formula I, wherein each of $R^1$, $R^2$, $R^3$, $R^4$, $R^5$, $R^6$ and $R^7$ is a bridging group having a formula —$(CH_2)_n$—, wherein n is an integer selected from 1 to 10, (preferably n is an integer independently selected from 1 to 4 for each of $R^1$, $R^2$, $R^3$, $R^4$, $R^5$, $R^6$, $R^7$; more preferably n is an integer independently selected from 2 to 4 for each of $R^1$, $R^2$, $R^3$, $R^4$, $R^5$, $R^6$, $R^7$; most preferably the second substance is diethylenetriaminepentakis(methylphosphonic acid)), (optionally, one or more of the nitrogens in the first substance can be provided in a quaternary form, wherein the nitrogen assumes a positive charge); and, wherein the second substance is according to formula II, providing a second substance according to formula II, wherein each of $R^8$, $R^9$, $R^{10}$, $R^{11}$ and $R^{12}$ is selected from hydrogen and an alkyl group having 1 to 6 carbon atoms (e.g., N,N,N',N'-tetramethyl-N", N"-dimethylguanidinium), (preferably, each of $R^8$, $R^9$, $R^{10}$, $R^{11}$ and $R^{12}$ are independently selected from a methyl group, an ethyl group, a propyl group, and a butyl group; more preferably, each of $R^8$, $R^9$, $R^{10}$, $R^{11}$ and $R^{12}$ is independently selected from a methyl group and an ethyl group; most preferably, each of $R^8$, $R^9$, $R^{10}$, $R^{11}$ and $R^{12}$ is a methyl group and the second substance is tetramethylguanidine), (optionally, one or more of $R^8$, $R^9$, $R^{10}$, $R^{11}$ and $R^{12}$ is an alkyl group having 1 to 6 carbon atoms, wherein the alkyl group is a halogenated alkyl group, such as a fully or partially halogenated ethyl, propyl, isopropyl, butyl, isobutyl, sec-butyl or tert-butyl group), (optionally, two or more of $R^8$, $R^9$, $R^{10}$, $R^{11}$ and $R^{12}$ can be combined to form a saturated or unsaturated ring structure (e.g., 1-methyl-7-n-propyl-1,5,7-triazabicyclo[4.4.0]dec-5-enium)), (optionally, one or more of the nitrogens in the second substance can be provided in a quaternary form, wherein the nitrogen assumes a positive charge); providing water; providing a pH adjusting agent; combining (a) at least one of the first substance and the second substance, (b) the abrasive and (c) the water to form a chemical mechanical polishing composition; and, adding the pH adjusting agent to adjust the pH of the chemical mechanical polishing composition to <7; providing a chemical mechanical polishing pad; creating dynamic contact at an interface between the chemical mechanical polishing pad and the substrate; and, dispensing the chemical mechanical polishing composition onto the chemical mechanical polishing pad at or near the interface between the chemical mechanical polishing pad and the substrate; wherein at least some of the silicon oxide material and the silicon nitride material are removed from the substrate; wherein the chemical mechanical polishing composition comprises, as initial components: 0.001 to 1 wt % (preferably 0.001 to 0.2 wt %, more preferably 0.008 to 0.03 wt %, most preferably 0.009 to 0.015 wt %) of the first substance; 0.001 to 5 wt % (preferably 0.01 to 1 wt %, more preferably 0.01 to 0.5 wt %, still more preferably 0.01 to 0.1 wt %, most preferably 0.02 to 0.06 wt %) of the second substance; 1 to 40 wt % (preferably 1 to 25 wt %, more preferably 1 to 10 wt %, most preferably 1 to 5 wt %) abrasive; and water; wherein the chemical mechanical polishing composition is formulated to exhibit a silicon oxide removal rate of 400 to 1100 Å/min, a silicon nitride removal rate of 400 to 1100 Å/min, and a silicon oxide to silicon nitride selectivity of 0.2 to 4.0 (preferably 0.5 to 2.0, more preferably 0.75 to 1.5, still more preferably 0.8 to 1.2, most preferably 0.9 to 1.2) at a pH of <7 (preferably ≦5, more preferably 2 to 4, most preferably 2 to 3); (most preferably wherein the first substance is diethylenetriaminepentakis(methylphosphonic acid) and the second substance is tetramethylguanidine); with a platen speed of 93 revolutions per minute, a carrier speed of 87 revolutions per minute, a chemical mechanical polishing composition flow rate of 200 ml/min, and a nominal down force of 20.7 kPa on a 200 mm polishing machine; wherein the chemical mechanical polishing pad comprises a poromeric polyurethane polishing layer coated over a felt substrate (e.g., Politex™ polishing pads available from Rohm and Haas Electronic Materials CMP Inc.).

EXAMPLES

Chemical Mechanical Polishing Compositions

The chemical mechanical polishing compositions (CMPCs) tested were prepared by combining the components in the amounts listed in Table 1 and adjusting the pH of the compositions to the final pH listed in Table 1 with nitric acid or potassium hydroxide.

TABLE 1

| CMPC | 1$^{st}$ substance$^¥$ (wt %) | 2$^{nd}$ substance$^Γ$ (wt %) | Abrasive$^£$ (wt %) | Final pH |
|---|---|---|---|---|
| 1 | 0 | 0.02 | 4 | 3.0 |
| 2 | 0 | 0.03 | 4 | 3.0 |
| 3 | 0 | 0.04 | 4 | 3.0 |
| 4 | 0 | 0.05 | 4 | 3.0 |
| 5 | 0 | 0.1 | 4 | 3.0 |
| 6 | 0 | 0.03 | 6 | 3.0 |
| 7 | 0 | 0.05 | 6 | 3.0 |
| 8 | 0.01 | 0 | 6 | 2.5 |
| 9 | 0.01 | 0.05 | 6 | 2.5 |
| 10 | 0.01 | 0.05 | 4 | 2.5 |

$^¥$the 1$^{st}$ substance used was diethylenetriaminepentakis(methylphosphonic acid) available from Aldrich.
$^Γ$the 2$^{nd}$ substance used was tetramethylguanidine available from Aldrich.
$^£$The abrasive used in the Examples was Klebosol ® PL1598B25 colloidal silica manufactured by AZ Electronic Materials.

Polishing Tests

The chemical mechanical polishing compositions described in Table 1 were tested using 200 mm blanket wafers, specifically TEOS dielectric wafers and silicon nitride wafers. An Applied Materials AMAT Mirra® 200 mm polishing machine was used to polish all of the blanket wafers in the Examples using a Politex™ HI Embossed poromeric polyurethane coated on a felt substrate and embossed with a cross pattern (commercially available from Rohm and Haas Electronic Materials CMP Inc.). The polishing conditions used in all of the Examples included a platen speed of 93 rpm; a carrier speed of 87 rpm; with a polishing medium flow rate of 200 ml/min and a downforce of 20.7 kPa. Removal rates for each of the polish experiments are provided in Table 2. Note that the removal rates were calculated from the before and after polish film thickness on the blanket wafers. Specifically, the removal rates for the TEOS wafers and silicon nitride wafers were determined using a SpectraFX 200 optical thin-film metrology system available from KLA-Tencor.

TABLE 2

| CMPC | TEOS Removal rate (Å/min) | Silicon Nitride removal rate (Å/min) | TEOS/Si$_3$N$_4$ Selectivity |
|---|---|---|---|
| 1 | 511 | 671 | 0.76 |
| 2 | 675 | 398 | 1.70 |
| 3 | 720 | 305 | 2.36 |
| 4 | 818 | 285 | 2.87 |
| 5 | 722 | 166 | 4.35 |
| 6 | 727 | 457 | 1.59 |
| 7 | 822 | 323 | 2.55 |
| 8 | 202 | 727 | 0.28 |
| 9 | 837 | 612 | 1.37 |
| 10 | 668 | 560 | 1.19 |

We claim:

1. A chemical mechanical polishing composition, comprising, as initial components:
a first substance according to formula I

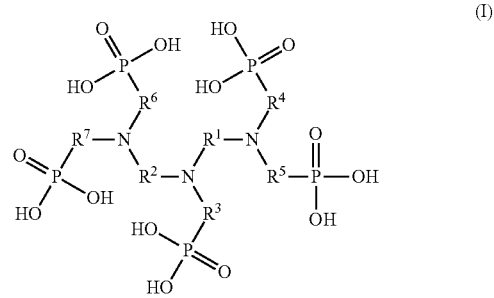

(I)

wherein each of $R^1$, $R^2$, $R^3$, $R^4$, $R^5$, $R^6$ and $R^7$ is a bridging group having a formula —(CH$_2$)$_n$—, wherein n is an integer selected from 1 to 10, and wherein, optionally, one or more of the nitrogens in the first substance can be provided in a quaternary form, where the nitrogen assumes a positive charge;
a second substance according to formula II

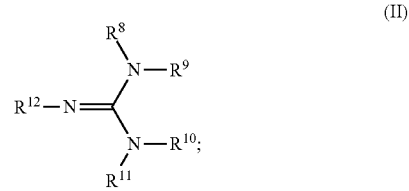

(II)

wherein each of $R^8$, $R^9$, $R^{10}$, $R^{11}$ and $R^{12}$ is selected from hydrogen and an alkyl group having 1 to 6 carbon atoms, wherein, optionally, two or more of $R^8$, $R^9$, $R^{10}$, $R^{11}$ and $R^{12}$ are combined into a ring structure, and wherein, optionally, one or more of the nitrogens in the second substance can be provided in a quaternary form, where the nitrogen assumes a positive charge;
an abrasive; and
water.

2. The chemical mechanical polishing composition of claim 1, wherein the chemical mechanical polishing slurry comprises, as initial components: 0.001 to 1 wt % of the first substance; 0.001 to 5 wt % of the second substance; 1 to 40 wt % abrasive; and water.

3. The chemical mechanical polishing composition of claim 2, having a pH of 2 to 4.

4. The chemical mechanical polishing composition of claim 3, wherein the first substance is diethylenetriaminepentakis(methylphosphonic acid) and the second substance is tetramethylguanidine.

5. The chemical mechanical polishing composition of claim 4, wherein the abrasive is a colloidal silica having an average particle size of 1 to 50 nm.

6. The chemical mechanical polishing composition of claim 1, further comprising an additional additive selected from a dispersant, a surfactant, a buffer, an anti-foaming agent and biocides.

7. A method of making the chemical mechanical polishing composition, comprising:
providing a first substance according to formula I

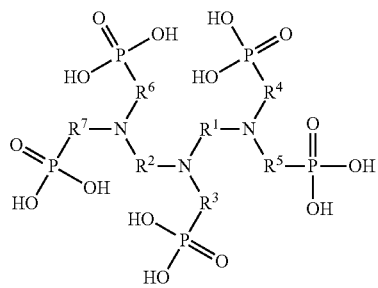

wherein each of $R^1$, $R^2$, $R^3$, $R^4$, $R^5$, $R^6$ and $R^7$ is a bridging group having a formula $—(CH_2)_n—$, wherein n is an integer selected from 1 to 10, and optionally, wherein one or more of the nitrogens in the first substance can be provided in a quaternary form, where the nitrogen assumes a positive charge;
providing a second substance according to formula II

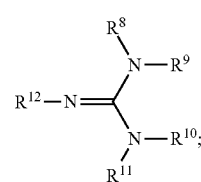

wherein each of $R^8$, $R^9$, $R^{10}$, $R^{11}$ and $R^{12}$ is selected from hydrogen and an alkyl group having 1 to 6 carbon atoms, optionally, two or more of $R^8$, $R^9$, $R^{10}$, $R^{11}$ and $R^{12}$ are combined into a ring structure, and optionally, wherein one or more of the nitrogens in the second substance can be provided in a quaternary form, where the nitrogen assumes a positive charge;
providing an abrasive;
providing water;
providing a pH adjusting agent;
combining the first substance, the second substance, the abrasive and the water to form a slurry; and,
adding the pH adjusting agent to the slurry to adjust the pH of the slurry to <7.

8. A method of chemical mechanical polishing of a substrate, comprising:
providing a substrate, wherein the substrate comprises a silicon oxide material and a silicon nitride material;
providing at least one of a first substance and a second substance;
wherein the first substance is according to formula I

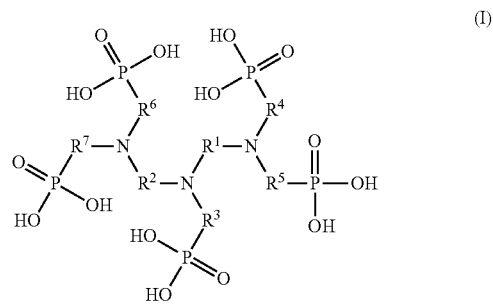

wherein each of $R^1$, $R^2$, $R^3$, $R^4$, $R^5$, $R^6$ and $R^7$ is a bridging group having a formula $—(CH_2)_n—$, wherein n is an integer selected from 1 to 10, and optionally, wherein one or more of the nitrogens in the first substance can be provided in a quaternary form, where the nitrogen assumes a positive charge; and, wherein the second substance is according to formula II

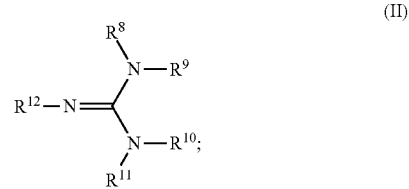

wherein each of $R^8$, $R^9$, $R^{10}$, $R^{11}$ and $R^{12}$ is selected from hydrogen and an alkyl group having 1 to 6 carbon atoms, optionally, two or more of $R^8$, $R^9$, $R^{10}$, $R^{11}$ and $R^{12}$ are combined into a ring structure, and optionally, wherein one or more of the nitrogens in the second substance can be provided in a quaternary form, where the nitrogen assumes a positive charge;
providing an abrasive;
providing water;
providing a pH adjusting agent;
combining (a) at least one of the first substance and the second substance, (b) the abrasive and (c) the water to form a chemical mechanical polishing composition; and, adding the pH adjusting agent to adjust the pH of the chemical mechanical polishing composition to <7;
providing a chemical mechanical polishing pad;
creating dynamic contact at an interface between the chemical mechanical polishing pad and the substrate; and,
dispensing the chemical mechanical polishing composition onto the chemical mechanical polishing pad at or near the interface between the chemical mechanical polishing pad and the substrate;

wherein at least some of the silicon oxide material and the silicon nitride material are removed from the substrate.

9. The method of claim 8, wherein the chemical mechanical polishing composition exhibits a silicon oxide to silicon nitride removal rate selectivity of 0.2 to 4.0.

10. The method of claim 9, wherein the chemical mechanical polishing composition exhibits a silicon oxide removal rate of 400 to 1100 Å/min; and a silicon nitride removal rate of 400 to 1100 Å/min.

* * * * *